United States Patent
Yu et al.

(10) Patent No.: US 7,910,014 B2
(45) Date of Patent: Mar. 22, 2011

(54) METHOD AND SYSTEM FOR IMPROVING WET CHEMICAL BATH PROCESS STABILITY AND PRODUCTIVITY IN SEMICONDUCTOR MANUFACTURING

(75) Inventors: Tai-Yung Yu, Rende Township (TW); Yu-Sheng Su, Tainan (TW); Li Te Hsu, Shanhua Township (TW); Jin Lin Liang, Alian Township (TW); Shih Cheng Yeh, Linbian Township (TW); Pin Chia Su, Shanhua Township (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 620 days.

(21) Appl. No.: 11/963,040

(22) Filed: Dec. 21, 2007

(65) Prior Publication Data

US 2009/0087929 A1  Apr. 2, 2009

Related U.S. Application Data

(60) Provisional application No. 60/995,805, filed on Sep. 28, 2007.

(51) Int. Cl.
*C03C 15/00* (2006.01)
*C03C 25/68* (2006.01)

(52) U.S. Cl. ............ 216/84; 438/710; 438/756; 216/99

(58) Field of Classification Search ............. 216/93, 216/99, 84; 438/745, 756
See application file for complete search history.

(56) References Cited

U.S. PATENT DOCUMENTS

| | | | |
|---|---|---|---|
| 6,207,068 B1 | 3/2001 | Glick et al. | |
| 6,399,517 B2 * | 6/2002 | Yokomizo et al. | 438/745 |
| 6,699,400 B1 * | 3/2004 | Ballantine et al. | 216/90 |
| 2002/0173154 A1 * | 11/2002 | Tucker et al. | 438/694 |

OTHER PUBLICATIONS

Zin-Chang Wei et al., Apparatus and Method for Controlling Silicon Nitride Etching Tank, U.S. Appl. No. 11/627,030, filed Jan. 25, 2007.

* cited by examiner

*Primary Examiner* — Roberts Culbert
(74) *Attorney, Agent, or Firm* — Duane Morris LLP

(57) ABSTRACT

A chemical processing bath and system used in semiconductor manufacturing utilizes a dynamic spiking model that essentially constantly monitors chemical concentration in the processing bath and adds fresh chemical on a regular basis to maintain chemical concentrations at desirable levels. Etch rates and etch selectivities are maintained at desirable levels and contamination from undesirable precipitation is avoided. The system and method automatically compare concentration levels to a plurality of control limits associated with various technologies and identify the technology or technologies that may undergo processing.

20 Claims, 2 Drawing Sheets

METHOD AND SYSTEM FOR IMPROVING WET CHEMICAL BATH PROCESS STABILITY AND PRODUCTIVITY IN SEMICONDUCTOR MANUFACTURING

RELATED APPLICATION

This application claims priority of U.S. Provisional Application Ser. No. 60/995,805, filed Sep. 28, 2007 and titled Universal APC Model to Improve Wet Bench Process Stability and Productivity, the contents of which are hereby incorporated by reference as if set forth in their entirety.

FIELD OF THE INVENTION

The present invention relates, most generally, to semiconductor device manufacturing. More particularly, the present invention relates to a method and system for stabilizing and controlling chemical solutions and processing systems used in etching, stripping, cleaning and other wet processing operations.

BACKGROUND

Semiconductor devices are formed on semiconductor substrates using a manufacturing process that typically includes several wet chemical processing operations. The wet processing operations include cleaning operations, stripping operations and etching operations in which the chemicals of the chemical bath react with a material such as a film or other material being etched or removed. The use of wet chemical benches to perform these operations has been and continues to be a standard in the semiconductor manufacturing industry.

As devices become more complex, feature sizes become more miniaturized and film thicknesses become reduced, it becomes increasingly important to eliminate contamination and to process the substrates in a uniform and repeatable manner. For example, as film thicknesses decrease and substrate sizes increase, it becomes increasingly challenging to completely and uniformly remove the thin film in a short time without attacking any underlying structures, i.e. so that the entire film clears at the same time. In order to effectuate a clean, uniform and repeatable wet chemical processing operation, the wet chemical processing bath should desirably be maintained in the same condition throughout the lifetime of the bath. For example, chemical concentrations and bath temperatures must be maintained uniformly throughout the bath and constant in time. Contaminants must be minimized. The etch rate or stripping rate of a bath is dependent upon the aforementioned conditions of the bath and it is very critical to maintain an etch or stripping rate that is constant in time as well as uniform throughout the bath.

One challenge in maintaining a constant etch or stripping rate, is that the etch or stripping rate is critically dependent on the concentration of the reactive chemical species in the bath, and this reactive chemical species is consumed during the etching/stripping operation. As an example that will be discussed below, the concentration of phosphoric acid determines the etching/stripping rate of silicon nitride. As such, it is of critical importance to maintain a constant concentration of the critical reactive chemical species during the period in which that chemical is being consumed by reacting with the semiconductor substrate.

In conventional processing, chemical concentrations, chemical bath temperatures and other characteristics are monitored after a number of semiconductor substrates have been processed, i.e., after several "runs". Naturally, the concentration of critical reactive chemicals diminish as they are consumed in time, and must be replenished. In some examples, a spiking technique is used to spike the chemical bath by adding a high concentration of the species that has become depleted in time. This spiking procedure, however, is done infrequently and allows the chemical bath concentration to undesirably change run-to-run as it becomes depleted and also causes the chemical bath concentration to undesirably spike above desired concentration levels when the replenishing occurs.

It would be therefore desirable to maintain the wet chemical bath to have constant chemical concentration levels, and therefore constant etch/strip rates, in time. This is especially true for the reactive chemical species.

Additionally, the reaction product between the reactive chemicals in the wet chemical bath and the material being removed, often produces precipitates in the wet chemical bath. It is critically important to prevent these precipitates from settling on the surface of the substrate being processed as they can block the complete removal of the film being etched or removed and they can present other contamination problems if they remain on the surface. It would therefore be desirable to monitor the concentration of these solid precipitates and efficiently remove them to maintain sufficiently low contamination levels in the bath.

Silicon nitride is a dielectric material that is very frequently used in many applications in the manufacture of semiconductor devices. A film of silicon nitride is typically formed over a semiconductor substrate upon which semiconductor devices are being fabricated. The silicon nitride film may be patterned using an etching process that includes phosphoric acid. In other embodiments, the remaining patterned portions of the silicon nitride film are stripped. In still other exemplary embodiments, a complete $Si_3N_4$ film may be removed by stripping. The wet chemical etching/stripping of silicon nitride has traditionally been done using hot phosphoric acid ($H_3PO_4$) at elevated temperatures. The basic chemical reactions that model the removal of silicon nitride by phosphoric acid are:

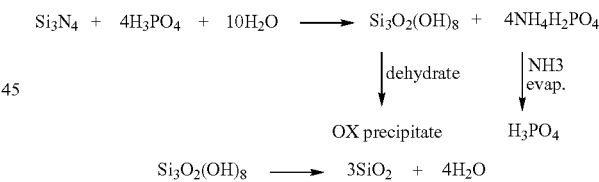

The silicon nitride etch/strip process is heavily influenced by process parameters including $H_3PO_4$ and silicon concentration, as evidenced by silica, $SiO_2$ precipitation, temperature of the etch bath and the bath life of the hot phosphoric bath. The oxide (silicon dioxide, $SiO_2$) etch rate is also affected by process conditions, in particular the silicon concentration in the etching bath. The oxide etch rate becomes dramatically lower as the Si concentration in the bath increases. The Si concentration therefore directly affects the silicon nitride:silicon oxide etch selectivity. If the silicon oxide etch rate increases with respect to the silicon nitride etch rate, underlying silicon oxide structures may be destroyed during the silicon nitride etch or stripping process.

It is therefore desirable to maintain the bath conditions such as the $H_3PO_4$ and silicon concentration and the bath temperature, at constant levels so as to produce constant etch rates and etch selectivities, and process repeatability. As bath life increases and the above reactions occur, however, these parameters may undesirably vary. It can be seen that it is critical to maintain and control the silicon, Si, concentration in order to maintain constant silicon nitride and silicon oxide etch rates and silicon nitride/oxide etch selectivity. Still referring to the chemical reaction equation, literature indicates that the oxide precipitate, i.e., the dehydration of $Si_3O_2(OH)_8$ to form $SiO_2$ and water, occurs after reaching saturation solubility at about 120 ppm at 165° C. Different temperatures have other saturation solubility levels but, at any rate, it is desirable to maintain a $SiO_2$ concentration that is low enough to avoid precipitation. The generation of oxide precipitates results in an undesirable particle source.

One known procedure for maintaining a wet silicon nitride etch process is to allow the silica to precipitate and to remove the precipitate in a process that involves decreasing the temperature. One silica extraction system is designed to remove the generated silica using lower temperature $H_3PO_4$ with a high Si concentration. Shortcomings of this procedure include the difficulty in maintaining a high extraction efficiency for precipitated silica, which may melt into the $H_3PO_4$ solution again if not removed quickly and if allowed a long reaction time.

Another procedure as provided in commonly-owned U.S. patent application Ser. No. 11/627,030 filed Jan. 25, 2007, the contents of which are hereby incorporated by reference as if set forth in their entirety, is to monitor the silicon in solution by diluting and cooling a phosphoric acid sample with deionized water. This procedure requires extra monitor systems as well as dilution and cooling capabilities.

Improved methods and systems for maintaining a wet chemical bath to have constant chemical concentration levels, and therefore constant etch/strip rates in time are therefore desirable.

SUMMARY OF THE INVENTION

To address these and other needs, and in view of its purposes, one aspect of the invention provides a method for controlling process stability in a processing bath used for processing semiconductor substrates. According to one exemplary embodiment, the method comprises providing a processing bath, performing a plurality of successive processing runs in the processing bath and, after each processing run, calculating Si concentration in the processing bath based on a film thickness parameter of a film that includes silicon and at least one other component. The method further provides for summing the Si concentration from each processing run to determine an aggregate Si concentration. The aggregate Si concentration is compared to each of a plurality of control limits, each control limit associated with a corresponding technology. The method further provides for terminating processing runs in the processing bath for each technology in which the aggregate Si concentration is outside the associated control limit and determining a volume of a chemical to dispense into the processing bath based on the aggregate Si concentration to ensure that the aggregate Si concentration in the processing bath lies within each of the control limits. The method also provides for automatically adding the calculated volume of chemical into the processing bath directly or indirectly.

According to another aspect, a method for controlling process stability in a processing bath used for processing semiconductor substrates is provided. The method comprises providing a processing bath, performing a plurality of successive processing runs and, after each processing run, calculating Si concentration in the processing bath based on a film thickness parameter of a film that includes silicon and at least one further component. After performing the plurality of successive processing runs, the method provides for determining an aggregate Si concentration by adding each calculated Si concentration and an initial Si concentration value. The method further provides for comparing the aggregate Si concentration to each of a plurality of control limits, each control limit associated with a corresponding technology, terminating processing runs in the bath for each technology in which the aggregate Si concentration is outside the associated control limit and calculating a volume of chemical to dispense into the processing bath based on the aggregate Si concentration to ensure that the aggregate Si concentration in the processing bath lies within each of the control limits. The method further provides for automatically adding the volume of chemical into the processing bath directly or indirectly.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
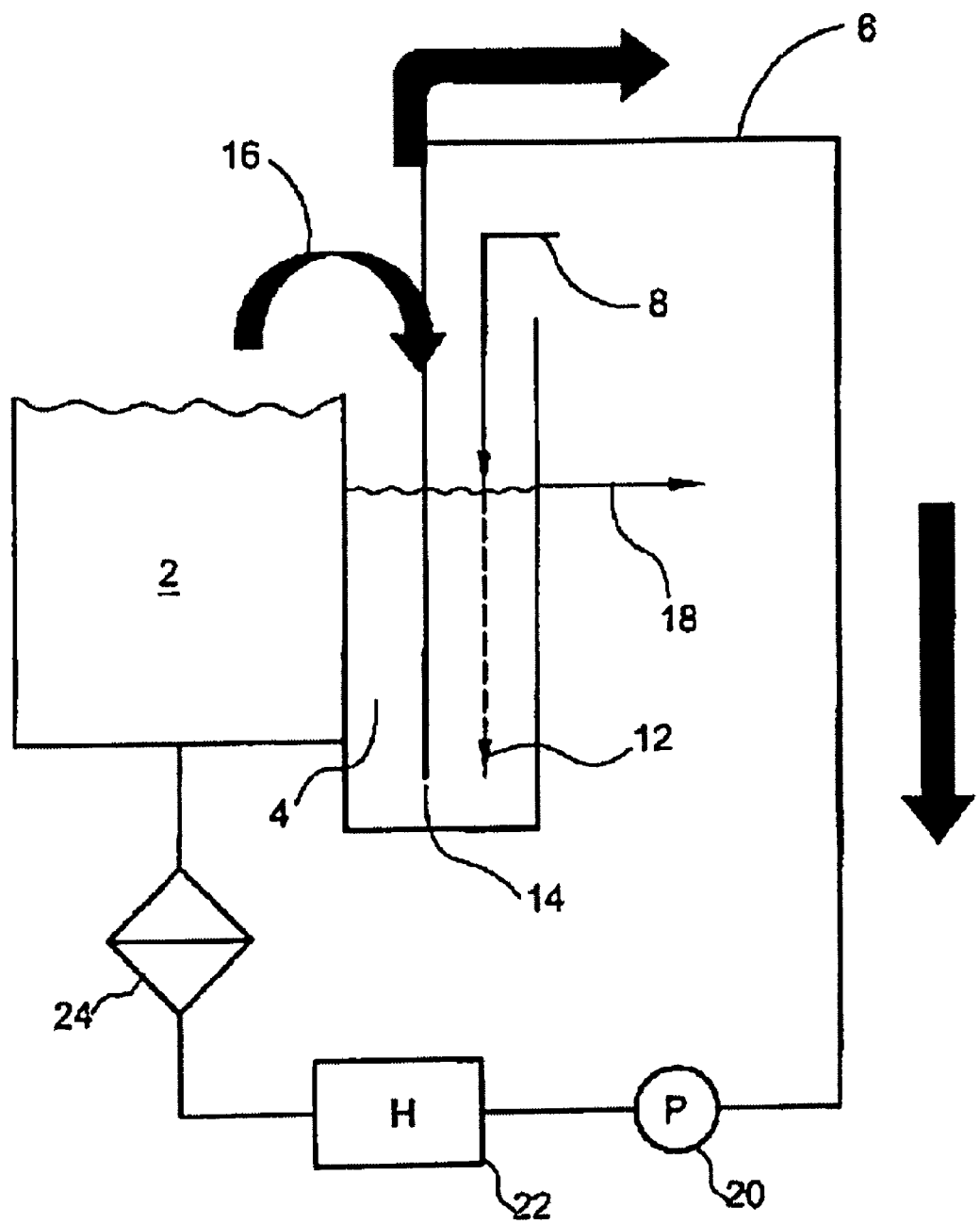
FIG. 1 is a schematic view showing a processing bath and overflow tank used in the present invention.

Provided is an automated process control (APC) method and system used in conjunction with a chemical or wet bath used in the manufacture of semiconductor devices. The method and system is applicable to various chemistries and although the following description will often be with respect to a hot phosphoric acid bath used to strip or etch a silicon nitride film, such is intended to be exemplary only and not limiting of the applications of the invention. According to other exemplary embodiments, the phosphoric acid bath may be used to strip or etch other silicon-containing films. According to other exemplary embodiments, a silicon nitride film may be etched or stripped by other chemicals and in still other exemplary embodiments, various other wet chemical baths may be used to etch or strip various other films, silicon-containing or otherwise, according to the concepts of the invention. A method and system for maintaining processing bath stability provides a processing bath in which the processing characteristics such as chemical concentrations and bath temperatures, are maintained substantially constant and within desired limits while the bath is being used to process semiconductor substrates. Contamination levels are also maintained at acceptably low levels. During and after processing runs, an amount of a critical chemical component is monitored and the bath composition is controlled to maintain a desired composition and prevent undesirable precipitates from forming. Before an undesirably high precipitate level accumulates in the processing bath, fresh chemical is added, i.e., dynamic "spiking" occurs on an ongoing i.e. regular or periodic basis, to maintain a precipitate-free processing bath with low contamination levels.

According to an embodiment in which a silicon nitride, $Si_3N_4$ film is etched or stripped using phosphoric acid, $H_3PO_4$, a system and method controls silicon nitride etch rates, silicon oxide etch rates and silicon nitride-silicon oxide etch selectivity in a hot phosphoric acid etching bath by monitoring and controlling the silicon concentration in the etching bath. The system may include one or more apparatuses and computer controlled devices. Conventional monitoring systems may be used to detect bath parameters.

The system and method monitors silicon concentration before silica precipitates from the bath. When silicon nitride is etched in a hot phosphoric acid bath, silicon from the silicon nitride is liberated and complexes with oxygen and hydroxyl groups and when the concentration of silicon becomes too high, as additional silicon nitride is etched, a silicon dioxide (silica, $SiO_2$) precipitate is formed according to the following chemical reaction.

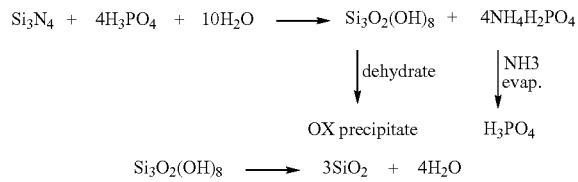

When semiconductor or other substrates with silicon nitride films thereon are etched in hot $H_3PO_4$, the silicon nitride is etched by the $H_3PO_4$ according to the above equations. One aspect of the invention is to monitor the Si concentration in the bath and maintain the Si concentration in the bath at a constant level to maintain constant etch rates and selectivities, as above. The Si concentration is also maintained at an acceptably low level in order to prevent the silica precipitation indicated above, from occurring. The silica precipitation is a particle source that degrades device yield.

Now referring to FIG. 1, exemplary system 1 includes inner tank 2, which serves as the processing bath, i.e., the bath in which semiconductor wafers are processed. In one exemplary embodiment, inner tank 2 may contain hot phosphoric acid and in one particular embodiment, the hot phosphoric acid, $H_3PO_4$, may be maintained at about 150° C. In other exemplary embodiments, the hot phosphoric acid in inner tank 2 may be maintained at a temperature within the range of about 70° C.-160° C. or other suitable temperatures. Various conventional heating members and techniques may be used to heat the $H_3PO_4$. Outer tank 4 is coupled to inner tank 2 via recirculation loop 6. Recirculation loop 6 delivers chemical from outer tank 4 to inner tank 2 and includes optional pump 20, heater 22 and filter 24 in the illustrated embodiment. Fresh chemical may be added via inlet pipe 8 which adds chemical directly to outer tank 4 and therefore indirectly to inner tank 2. According to one exemplary embodiment, the volume in the system is maintained at a constant level. As such, when fresh chemical is added by way of inlet pipe 8 to the bottom 12 of outer tank 4, the fresh chemical mixes with the chemical already present in outer tank 4 and therefore, when fresh chemical is added to outer tank 4 by inlet pipe 8 at location 12, circulation loop 6 delivers a high percentage of fresh chemical to inner tank 2 because of the proximity of inlet port 14 of circulation loop 6, to delivery point 12 of inlet pipe 8.

Volume of inner tank 2 is preferably maintained essentially at a constant level and the total volume of inner tank 2 and outer tank 4 may also be held constant. As such, when chemical is added to outer tank 4 with recirculation loop 6 operating, chemical is delivered to inner tank 2 and overflow chemical is delivered from inner tank 2 to outer tank 4 as indicated by overflow arrow 16. In one exemplary embodiment, circulation loop 6 constantly delivers chemical from outer tank 4 to inner tank 2. In response to overflow chemical being delivered from inner tank 2 to outer tank 4, a constant volume of chemical in system 1 is maintained as excess chemical is removed from outer tank 4 by way of overflow pipe 18. By maintaining a substantially constant system volume, Si concentration in the system may be derived if the system volume and amount of silicon in solution are known.

Figure 2:
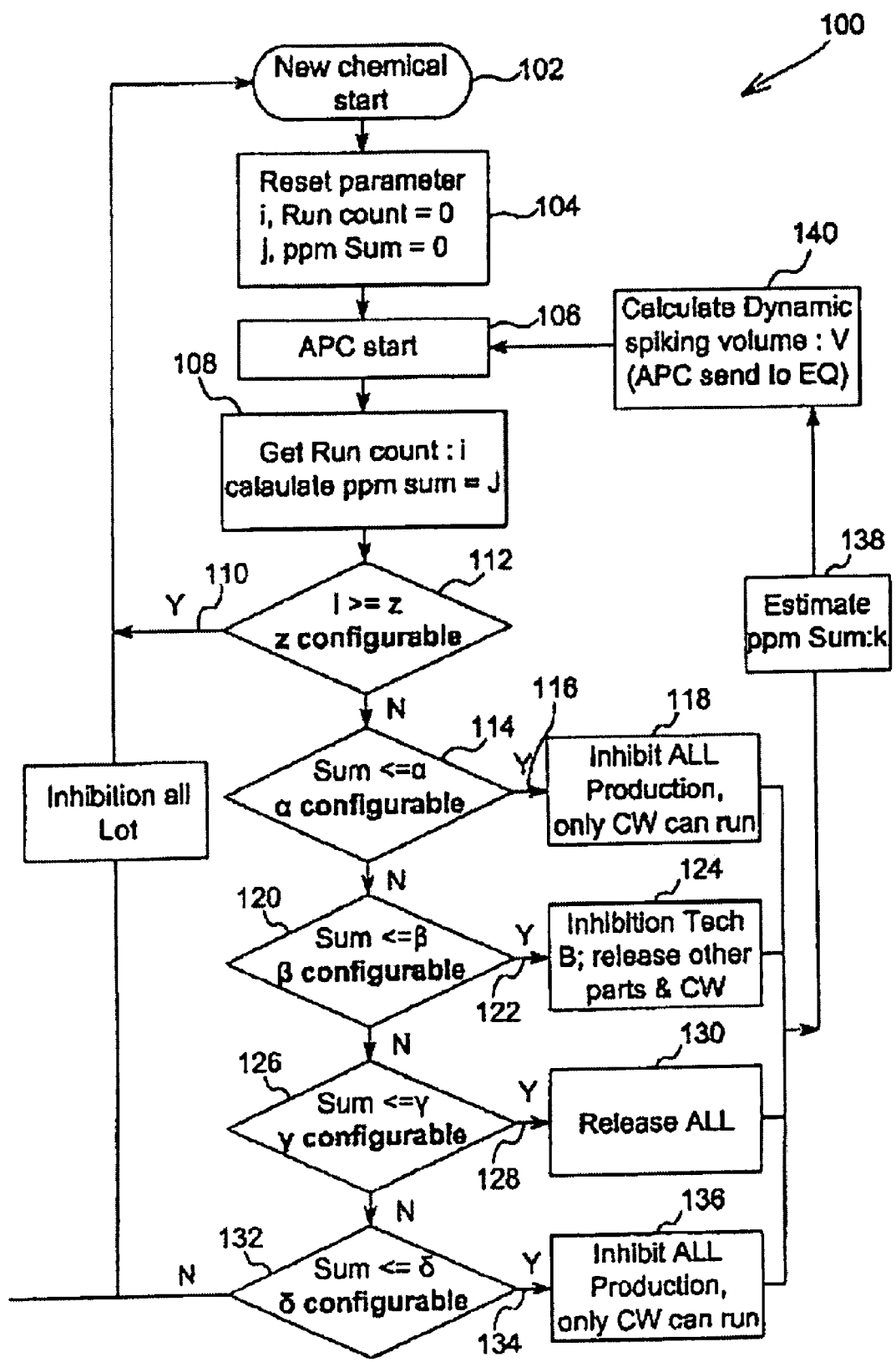
FIG. 2 is a flowchart that illustrates a method of the present invention.

Conventional monitoring tools associated with system 1, such as for monitoring temperatures and chemical concentrations, are not shown FIG. 2 is a flow chart illustrating an exemplary sequence for carrying out the method according to an exemplary embodiment of the invention. Flow chart 100 illustrates an exemplary method for controlling a processing bath to maintain an acceptable Si concentration sufficient to avoid silica precipitation and to maintain the chemical composition of the bath within desirable processing limits so as to control and maintain silicon nitride etch/strip rates and silicon oxide etch/strip rates at acceptable levels. Table 1 identifies many of the parameters referred to in the flow chart of FIG. 2.

TABLE 1

| Parameter: |
|---|
| Z: Max run count. |
| α: lower Si ppm-Technology A |
| β: lower Si ppm-Technology B. |
| γ: upper Si ppm-Technology B . . . |
| δ: upper Si ppm-Technology A |
| k: after run Si ppm |
| V: dynamic spiking volume |
| λ: target PPM. |
| θ: lowest spiking criteria. |
| ν: highest spiking criteria. |

At step 102, new i.e., fresh, chemical is added to the processing bath to initiate the process. At step 104, parameters I (run count) and J (sum of Si concentration), are set or reset to zero. At step 106, the automatic process control (APC) system is started and production lot processing begins. A processing operation or process run may constitute a single substrate, a plurality of substrates, a group such as a lot of substrates or multiple lots of substrates being processed in inner tank 2 (see FIG. 1) at the same time. The processing operation may be a stripping operation that strips a residual patterned portion of a silicon nitride film or the entire film or it may be an etching operation which spatially selectively removes unmasked portions of a silicon nitride film. At step 108, the number of processing runs is indexed and the aggregate Si concentration is determined.

According to one exemplary embodiment in which the volume of the processing bath is maintained at a constant level, the Si concentration may be derived by determining the amount of silicon liberated into solution by reaction. According to one exemplary embodiment in which an unpatterned blanket film of silicon nitride is removed from a substrate surface, equation 1 may be used to determine the concentration of Si, in ppm, in the processing bath.

$$\begin{aligned}&\text{Calculate weight of Si in (mg) liberated based} \quad &\text{Equation 1}\\&\text{on Si}_3\text{N}_4 \text{ film thickness in (cm)}\\&\text{Si (mg)} = \text{Si}_3\text{N}_4 \ THK \ (\text{cm}) \times (\pi \times 15 \ \text{cm}^2) \times 3.1 \ (\text{g/cm}^3) \times\\&\quad ((28 \times 3)/(28 \times 3 + 7 \times 4)) \times 1000 \ \text{mg/g}\\&\text{Weight of H}_3\text{PO}_4 \text{ solution (kg)} = 50 \ \text{L} \times \begin{bmatrix}(86\% \times 1.7) + \\ (14\% \times 1)\end{bmatrix}\\&\text{Liberated Si (ppm)} = \text{Si (mg)} / \text{Weight of H}_3\text{PO}_4\\&\quad \text{solution (kg)}\end{aligned}$$

Equation 1 covers the exemplary embodiment in which a 50 liter tank, i.e., processing bath is used, the substrate has a radius of 15 cm, the $H_3PO_4$ is an 86% solution, the SN is stoichiometric $Si_3N_4$, and $((28\times3)/(28\times3+7\times4))$ represents the calculation of weight portion of Si in $Si_3N_4$. According to one exemplary embodiment in which a silicon nitride film of known thickness is completely removed, the film thickness, SN THK, may be determined by pre-measuring the silicon nitride film thickness or otherwise determining film thickness prior to removal. According to another exemplary embodiment, in which the unpatterned blanket film of silicon nitride is not completely removed, the parameter SN THK may be determined by measuring the thickness of the silicon nitride film before and after processing. Equation 1 is intended to be exemplary only and in other exemplary embodiments, such as embodiments in which a patterned silicon nitride film is being etched or removed, a variant of equation 1 that takes into account pattern density, may be used. In still other exemplary embodiments, other techniques for determining the amount of Si liberated from a substrate when a film including silicon and at least one other component is removed, may be used.

After the number of processing runs are counted and the aggregate Si concentration is determined at step 108, the system automatically begins comparing this data to preprogrammed values. The aggregate Si concentration is achieved by summing the Si concentration values for each of the processing runs that have been carried out since the APC start step 106 and adding this sum to any initial Si concentration that may have been present. The aggregate Si concentration may be determined after each processing run or at a lesser frequency. One aspect of the invention illustrated at step 112, is that the run count is compared to a preprogrammed maximum run count and if the run count exceeds the maximum run count, yes 110, the process returns to new chemical start step 102. If the maximum run count has not been exceeded, the aggregate Si concentration is compared to a plurality of different control limits associated with different technologies. For example, at step 114, if the sum of Si concentration is less than the lower control limit defined by α, then the technology associated with the α control limits (Technology A) can no longer undergo processing in the bath. According to an exemplary embodiment in which α is the lowest lower control limit, if the sum of Si concentration is below the lower control limit, yes 116, all production is inhibited at step 118 and only control wafers, CW, may be processed. If the sum is above the lowest control limit α, then the concentration is compared to control limit β at step 120. If the concentration is below the β control limit but still above the lower control limit α, yes 122, then only the process technology associated with the β control limit (Technology B) is inhibited at step 124 and other production runs may continue. Similar comparisons are made at steps 126 and 132 and if the monitored concentration, i.e. Sum, is within the indicated upper control limits γ and δ, i.e., yes 128, 134, then the appropriate action as indicated at steps 130, 136 is taken. The upper control limits are established to prevent silica precipitation from occurring in the bath. None of the upper control limits are greater than a precipitate control limit above which silica precipitation occurs at a particular bath temperature used.

After the appropriate production decisions are made at steps 118, 124, 130, 136, the derived concentration in parts per million, κ, step 138, is used to determine the dynamic spiking volume, V, to be added to the processing tank at step 140. In one exemplary embodiment, Equation 2 may be used to calculate the volume V to be added to the tank system, as described in conjunction with FIG. 1. As with equation 1, equation 2 represents the exemplary embodiment in which the tank, i.e. processing bath volume is 50 L. A minimal spiking volume, θ in Equation 2 or a maximum spiking volume, v in Equation 2, may also be specified and may override the calculated dynamic spiking volume V, in some exemplary embodiments. In other exemplary embodiments, other methods of calculation may be used.

$$\begin{aligned}&\text{Dynamic spiking volume: } V &\text{Equation 2}\\&(APC \text{ send to } EQ)\\&\text{Target } PPM : \lambda\\&\kappa * (50 - V)/50 = \lambda\\&V = 50 - (50 * \lambda)/\kappa\\&\text{If } V < \theta \text{ liter, fixed spiking } \theta;\\&\text{minimum volume } \theta \text{ is added}\\&\text{If } V > v \text{ liter, fixed spiking } V;\\&\text{maximum volume } v \text{ is added}\end{aligned}$$

After the volume V to be added to the tank system is determined, such volume V is added by way of inlet pipe 8 according to the illustrated embodiment of FIG. 1. It should be noted that other tank systems may be used and the chemical may be added to the system using various other arrangements and techniques. After the appropriate volume V is added, the system continues at step 106 at which the present Si concentration in the bath is used as an initial Si concentration with respect to subsequent processing runs. The additional Si added to the bath by way of the chemical reaction that takes place during the processing runs, as described above, is added to the "initial" Si concentration and the summing of the Si concentration continues as processing runs continue. An aggregate Si concentration, the sum of the "initial" Si concentration and the Si concentration produced by processing runs after the system returns to step 106, is then used for future calculations.

In this manner, the Si concentration is maintained at a desirable level and the nitride and oxide etch rates are maintained at substantially constant and desirable levels. Undesirable silica precipitation is avoided.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for controlling process stability in a processing bath used for processing semiconductor substrates, said method comprising:
   providing a processing bath;
   performing a plurality of successive processing runs in said processing bath, each said processing run removing at least part of at least one film that includes silicon and at least one further component;
   after each said processing run, calculating Si concentration in said processing bath based on a film thickness parameter of said film;
   summing each said Si concentration from each said processing run to determine an aggregate Si concentration;
   comparing said aggregate Si concentration to each of a plurality of control limits, each said control limit associated with a corresponding technology;
   terminating processing runs in said processing bath for each said technology in which said aggregate Si concentration is outside said associated control limit;
   determining a volume of a chemical to dispense into said processing bath based on said aggregate Si concentration to ensure that said aggregate Si concentration in said processing bath lies within each of said control limits; and
   automatically adding said volume of said chemical into said processing bath directly or indirectly.

2. The method as in claim 1, wherein each said processing run includes simultaneously processing a plurality of said semiconductor substrates.

3. The method as in claim 1, wherein said automatically adding said chemical includes maintaining substantially a constant volume in said processing bath.

4. The method as in claim 1, further comprising, after said automatically adding said chemical, performing a plurality of successive further processing runs in said processing bath;
   after each said further processing run, calculating adjusted Si concentration in said processing bath based on said film thickness parameter of a further film that includes silicon and at least one further component;
   summing each said adjusted Si concentration from each said further processing run to determine an aggregate adjusted Si concentration;
   comparing said aggregate adjusted Si concentration to each of said plurality of control limits;
   terminating further processing runs in said processing bath for each said technology in which said aggregate adjusted Si concentration is outside said associated control limit;
   determining a further volume of a chemical to dispense into said processing bath based on said aggregate adjusted Si concentration to ensure that said aggregate adjusted Si concentration in said bath lies within each of said control limits; and
   automatically adding said further volume of said chemical into said bath directly or indirectly.

5. The method as in claim 1, further comprising maintaining said processing bath temperature at a desired temperature during said performing and said determining.

6. The method as in claim 1, wherein said processing bath comprises an inner bath and said automatically adding comprises delivering said chemical to an outer bath which delivers fluid to said inner bath via a circulating line.

7. The method as in claim 1, wherein said processing runs comprise one of etching and stripping said film.

8. The method as in claim 1, wherein said film comprises silicon nitride.

9. The method as in claim 8, wherein said chemical comprises phosphoric acid.

10. The method as in claim 1, wherein said chemical comprises phosphoric acid.

11. The method as in claim 10, wherein said processing bath comprises a majority of phosphoric acid.

12. The method as in claim 1, wherein said automatically adding includes an APC (automatic process controller) communicating with a mass flow controller.

13. The method as in claim 1, wherein said determining comprises calculating Si concentration in said processing bath by measuring film thickness before and after said processing run.

14. The method as in claim 1, wherein said determining comprises calculating Si concentration in said processing bath based on a known film thickness prior to said processing run and wherein each said processing run completely removes said film.

15. The method as in claim 1, wherein said automatically adding comprises indirectly adding said chemical by delivering said chemical to an overflow bath and delivering fluid from said overflow bath to said processing bath.

16. The method as in claim 1, wherein said summing is performed following each said processing run.

17. The method as in claim 1, wherein said determining further comprises establishing minimum and maximum volumes of said chemical that may be dispensed into said processing bath.

18. The method as in claim 1, wherein said determining further comprises providing a precipitate control limit above which silica precipitation forms and in which none of said control limits are greater than said precipitate control limit.

19. A method for controlling process stability in a processing bath used for processing semiconductor substrates, said method comprising:

providing a processing bath;

performing a plurality of successive processing runs, each said processing run removing at least part of at least one film that includes silicon and at least one further component;

after each said processing run, calculating Si concentration in said processing bath based on a film thickness parameter of said film;

after said performing a plurality of successive processing runs, determining an aggregate Si concentration by adding each said Si concentration and an initial Si concentration value;

comparing said aggregate Si concentration to each of a plurality of control limits, each said control limit associated with a corresponding technology;

terminating processing runs in said processing bath for each said technology in which said aggregate Si concentration is outside said associated control limit;

calculating a volume of a chemical to dispense into said processing bath based on said aggregate Si concentration to ensure that said aggregate Si concentration in said processing bath lies within each of said control limits; and automatically adding said volume of said chemical into said processing bath directly or indirectly.

20. The method as in claim 19, further comprising recalculating said Si concentration after said automatically adding and repeating said performing, said calculating, said determining and said comparing by using said recalculated Si concentration as said initial Si concentration value.

* * * * *